(12) United States Patent
Soussan et al.

(10) Patent No.: US 9,000,588 B2
(45) Date of Patent: Apr. 7, 2015

(54) METHOD FOR SELF-ASSEMBLY OF SUBSTRATES AND DEVICES OBTAINED THEREOF

(71) Applicant: IMEC, Leuven (BE)

(72) Inventors: Philippe Soussan, Marseilles (FR); Wenqi Zhang, Leuven (BE); Silvia Armini, Leuven (BE)

(73) Assignee: IMEC, Leuven (BE)

( * ) Notice: Subject to any disclaimer, the term of this patent is extended or adjusted under 35 U.S.C. 154(b) by 12 days.

(21) Appl. No.: 13/975,811

(22) Filed: Aug. 26, 2013

(65) Prior Publication Data
US 2014/0054771 A1 Feb. 27, 2014

(30) Foreign Application Priority Data
Aug. 24, 2012 (EP) .................................. 12181742

(51) Int. Cl.
*H01L 23/48* (2006.01)
*H01L 23/00* (2006.01)
*H01L 25/00* (2006.01)

(52) U.S. Cl.
CPC ............... *H01L 24/11* (2013.01); *H01L 25/50* (2013.01); *H01L 24/14* (2013.01); *H01L 24/81* (2013.01); *H01L 2224/11912* (2013.01); *H01L 2224/81007* (2013.01); *H01L 2224/81143* (2013.01); *H01L 2225/06513* (2013.01);
(Continued)

(58) Field of Classification Search
CPC ......... H01L 24/13; H01L 24/16; H01L 24/81; H01L 24/11; H01L 24/14
USPC .......................................... 257/737; 438/613
See application file for complete search history.

(56) References Cited

U.S. PATENT DOCUMENTS

| 6,053,395 A | 4/2000 | Sasaki |
| 2002/0072163 A1* | 6/2002 | Wong et al. ................... 438/200 |

(Continued)

FOREIGN PATENT DOCUMENTS

DE 102009050426 B3 3/2011

OTHER PUBLICATIONS

Fukushima, T. et al., "Self-Assembly Technologies with High-Precision Chip Alignment and Fine-Pitch Microbump Bonding for Advanced Die-to-Wafer 3D Integration", 2011 Electronic Components and Technology Conference, May 31-Jun. 3, 2011, pp. 2050-2055.

(Continued)

*Primary Examiner* — Trung Q Dang
(74) *Attorney, Agent, or Firm* — McDonnell Boehnen Hulbert & Berghoff LLP

(57) ABSTRACT

A method for defining regions with different surface liquid tension properties on a substrate is disclosed. The method includes: providing a substrate with a main surface having a first surface liquid tension property that is at least partially covered with a seed layer; forming at least one micro-bump on the seed layer leaving part of the seed layer exposed; patterning the exposed seed layer to expose part of the main surface; forming at least one closed-loop structure that encloses a region of the main surface and the at least one micro-bump; and chemically treating the main surface of the substrate to provide on a surface of at least one closed-loop structure and the at least one micro-bump a second surface liquid tension property. The second surface liquid tension property is substantially different from the first surface liquid tension property of the main surface and is liquid phobic.

15 Claims, 6 Drawing Sheets

(52) U.S. Cl.
CPC ...... *H01L 2225/06593* (2013.01); *H01L 24/13* (2013.01); *H01L 24/16* (2013.01); *H01L 2224/0361* (2013.01); *H01L 2224/0401* (2013.01); *H01L 2224/05611* (2013.01); *H01L 2224/05624* (2013.01); *H01L 2224/05647* (2013.01); *H01L 2224/05666* (2013.01); *H01L 2224/05681* (2013.01); *H01L 2224/10135* (2013.01); *H01L 2224/11462* (2013.01); *H01L 2224/13082* (2013.01); *H01L 2224/13109* (2013.01); *H01L 2224/13111* (2013.01); *H01L 2224/13147* (2013.01); *H01L 2224/81002* (2013.01); *H01L 2224/81193* (2013.01); *H01L 2224/81815* (2013.01); *H01L 2224/03912* (2013.01); *H01L 2224/05572* (2013.01)

(56) References Cited

U.S. PATENT DOCUMENTS

| | | | |
|---|---|---|---|
| 2007/0007237 | A1 | 1/2007 | Wu et al. |
| 2007/0023907 | A1* | 2/2007 | Fork et al. ............... 257/738 |
| 2007/0210450 | A1 | 9/2007 | Jang et al. |
| 2008/0023435 | A1 | 1/2008 | Wu et al. |
| 2009/0023243 | A1 | 1/2009 | Koyanagi |
| 2010/0092741 | A1 | 4/2010 | Tseng et al. |
| 2010/0248424 | A1 | 9/2010 | Luce et al. |
| 2011/0008632 | A1 | 1/2011 | Zheng et al. |
| 2011/0193211 | A1* | 8/2011 | Chandrasekaran et al. .. 257/686 |
| 2012/0021563 | A1 | 1/2012 | Koyanagi et al. |

OTHER PUBLICATIONS

Chapuis, Y.A. et al., "Alternative Approach in 3D MEMS-IC Integration Using Fluidic Self-Assembly Techniques", Journal of Micromechanics and Microengineering, vol. 19, Issue 10, Article ID 105002, Sep. 2009, pp. 1-9.

Tan, Chuan Seng, "Application of Self-Assembled Monolayer (SAM) in Low Temperature Bump-Less Cu-Cu Bonding for Advanced 3D IC", 2010 5th International Microsystems Packaging Assembly and Circuits Technology Conference (IMPACT), Oct. 20-22, 2010, Taipei pp. 1-4.

Balakrishnan, S. et al., "Self Assembly of Microcomponents on Patterned Substate Using Capillary Force", Proceedings of the 7th Electronics Packaging Technology Conference, Dec. 7-9, 2005, Singapore, pp. 148-152.

Chang, Chia-Shou et al., "Self-Assembly of Microchips on Substrates", Proceedings of the 56th Electronic Components and Technology Conference, May 30, 2006-Jun. 2, 2006, San Diego, California, pp. 1533-1538.

Chang, Bo et al., "Capillary-Driven Self-Assembly of Microchips on Oleophilic/Oleophobic Patterned Surface Using Adhesive Droplet in Ambient Air", Applied Physics Letters, No. 99, Jul. 22, 2011, pp. 034104-1-034104-3.

Chang, Bo et al., "Hybrid Micro Assembly of Microchips on Segmented Patters", 6th Annual IEEE Conference on Automation Science and Engineering, Toronto, Ontario, Canada, Aug. 21-24, 2010, pp. 15-20.

Chang, Chia-Shou et al., "Microchip Self-Assembly on a Substrate Using Plasma Treatment", IEEE Transactions on Advanced Packaging, vol. 31, No. 2, May 2008, pp. 404-409.

Srinivasan, Uthara et al., "Microstructure to Substrate Self-Assembly Using Capillary Forces", Journal of Microelectromechanical Systems, vol. 10, No. 1, Mar. 2001, pp. 17-24.

Fukushima, T. et al., "Multichip Self-Assembly Technique on Flexible Polymeric Substrate", 58th Electronic Components and Technology Conference, May 27-30, 2008, pp. 1532-1537.

Tanaka, T. et al., "Development of Self-Assembled 3-D Integration Technology and Study of Microbump and TSV Induced Stress in Thinned Chip/Wafer", 2010 IEEE International SOI Conference, Oct. 11-14, 2010, San Diego, California, pp. 1-4.

Fukushima, Takafumi et al., "Multichip Self-Assembly Technology for Advanced Die-to-Wafer 3-D Integration to Precisely Align Known Good Dies in Batch Processing", IEEE Transactions on Components, Packaging and Manufacturing Technology, vol. 1, No. 12, Dec. 2011, pp. 1873-1884.

\* cited by examiner

METHOD FOR SELF-ASSEMBLY OF SUBSTRATES AND DEVICES OBTAINED THEREOF

CROSS-REFERENCE TO RELATED APPLICATION

This application claims priority to European Patent Application No. 12181742.3 filed on Aug. 24, 2012, the contents of which are hereby incorporated by reference.

TECHNICAL FIELD

The present disclosure relates in general to the field of semiconductors, optoelectronics, and microelectromechanical system ("MEMS") packaging and, more specifically, to methods for self-assembling semiconductor optoelectronics and MEMS devices into functional systems.

BACKGROUND

The integration of micro-scale or nano-scale semiconductor devices into multifunction systems is one of the main challenges in the field of semiconductor packaging. The challenge arises from the incompatibility of fabrication steps required for manufacturing different semiconductor devices. As a result of this incompatibility, the monolithic integration approach, where devices are manufactured in a common substrate, cannot be followed. Therefore, in a heterogeneous functional system the semiconductor devices are manufactured separately and assembled at a later stage to form a multifunction system.

Robotic "pick-and-place" is a commonly adopted method for assembling and packaging separate semiconductor devices into functional systems. This technique has been used in the integration of large scale semiconductor devices and has been proven to be both accurate and reliable. However, as semiconductor device dimensions continue to shrink, this assembling technique becomes less preferable. A main disadvantage of the robotic pick-and-place method is that it does not offer the required accuracy for assembling small semiconductor devices comprising hundreds or even thousands of fine-pitch micro-bumps. In addition, given the serial nature of the robotic pick-and-place technique, the throughput is considerably low, thereby making the overall process of forming a multifunction system expensive.

An alternative packaging solution to the robotic pick-and-place is the self-assembly ("SA") of semiconductor devices. The use of SA allows the autonomous organization of components into ordered patterns and structures without human intervention. As a result, SA is parallel in nature and can be applied to a wide range of semiconductor device dimensions Fukushima et al. [Fukushima, T.; Ohara, Y.; Murugesan, M.; Bea, J.-C.; Lee, K.-W.; Tanaka, T.; Koyanagi, M.; "Self-Assembly Technologies with High-Precision Chip Alignment and Fine-Pitch Microbump Bonding for Advanced Die-to-Wafer 3D Integration," Electronic Components and Technology Conference (ECTC), 2011 IEEE 61st, vol., no., pp. 2050-2055, May 31, 2011-Jun. 3 2011] describes such an SA method of semiconductor substrates with indium/gold micro-bump arrays formed on a bonding surface. However, the precise alignment of the semiconductor substrate is still an issue. This is because the precise alignment of the semiconductor substrates is highly dependent on the formation on the hydrophobic regions with respect to the fine-pitch micro-bumps. As a result errors during formation of the hydrophobic regions may result in miss-alignment between the droplet confinement, which is controlled by the hydrophobic region, and the micro-bumps. This miss-alignment is of particular concern to the assembly of semiconductor devices with fine pitch micro-bumps. Such a miss-alignment can cause shorts or weak connections between fine-pitch micro-bumps, thereby compromising the yield of the functional system. Moreover, the method presented does not provide any provisions for protecting from oxidization micro-bumps comprising oxidizing material that are commonly used in semiconductor fabrication. A further shortcoming of the proposed SA method is the use of thermo-compression for permanently bonding the semiconductor substrates, which can compromise the yield of certain semiconductor substrates that contain devices sensitive to high temperatures and forces applied during this step. In addition, the final thermal compression at elevated temperature can cause some misalignment due to coefficient of thermal expansion ("CTE") mismatch.

Therefore, there is a need for providing an SA method that offers high assembly accuracy of devices with fine-pitch micro-bumps and is compatible with conventional processing flows.

SUMMARY

It is an aim of the present disclosure to provide a method enabling SA of semiconductor optoelectronics and MEMS devices with high accuracy, thereby overcoming deficiencies of the prior art.

It is a further aim of the present disclosure to provide an SA method that is compatible with conventional processing flow for forming fine-pitch micro-bumps comprising oxidizing materials.

These and other aims are achieved according to the disclosure with the methods and systems showing the technical characteristics of the claims.

In a first aspect of the present disclosure, a method is proposed for enabling SA of substrates by defining regions with different surface liquid tension properties on a substrate, the method comprising the steps of: providing a substrate with a main surface having a first surface liquid tension property, the main surface being at least partially covered with a seed layer and further comprising at least one micro-bump formed on the seed layer, thereby leaving part of the seed layer exposed; patterning the exposed seed layer thereby exposing part of the main surface for and forming at least one closed loop structure enclosing a region of the main surface; and chemically treating the main surface of the substrate thereby generating on the surface of the at least one closed loop structure and of the at least one micro-bump a second surface liquid tension property, with the second surface liquid tension property being substantially different from the first surface liquid tension property of the main surface.

In an embodiment according to the first aspect of the present disclosure, the SA accuracy may be improved by providing on the main surface of a substrate at least one closed loop structure for confining the liquid droplet used during SA. Wherein the substrate may comprise semiconductor, optoelectronics or MEMS devices. The at least one closed structure is patterned on the exposed seed layer, wherein the seed layer comprises electrically conductive material, for example Cu, TiN, Ti, TiW, Ta, TaN, Al, and/or Sn. The micro-bumps also comprise electrically conductive solder materials, for example Cu-based solder, CuSn-based solders, AuSn-based solders, and/or In-based solders. An advantage of this embodiment is the at least one closed-loop structure and the at least one micro-bump are defined at the same processing step of patterning the seed layer. As a result, the misalignment due to processing tool error is minimized.

In a further embodiment according to the first aspect of the present disclosure, the main surface of the substrate is functionalized through chemical treatment, thereby forming regions of different surface liquid tension properties for confining the liquid droplet used during SA. This step involves the deposition of a material selected to provide the surfaces of the at least one closed-loop structure and of the at least one solder bump with a second surface liquid tension property, which is different to the liquid surface tension property of the main surface. The functionalization of the main surface corresponds to the chemical composition of the liquid droplet to be used during SA. For example, in the case where a water-based liquid droplet is used, the surfaces of the at least one closed-loop structure and at least one micro-bump may be provided with hydrophobic properties, while the main surface may be provided with hydrophilic properties. The material selected to be deposited may belong to the group of thiol-ended self-assembly monolayers ("SAMs"), which can selectively be absorbed by electrically conductive materials found on the surfaces of the at least one closed-loop structure and at least one micro-bump, thereby rending these surfaces hydrophobic. It is to be understood that the polarity of the surface liquid tension regions can be adjusted according to the material selected to be deposited. Therefore, the present disclosure is not limited to this embodiment. An advantage of this embodiment is that the deposition of thiol-ended SAMs is compatible with a conventional process flow and that these thiol-ended SAMs can be deposited from the vapor or from the liquid phase. In addition, the functionalization of the main surface to obtain regions of different surface liquid tension properties can be performed locally, since thiol-ended SAMs are selectively absorbed by certain material. Moreover, a water-based liquid droplet might result in an oxidization of the surfaces of the at least one closed-loop structure and the at least one micro-bump. In this case, thiol-ended SAMs prevent the surfaces of the at least one closed-loop structure and of the at least one micro-bump from being oxidized during the SA method. The oxidization can be further prevented by using a liquid droplet having a chemical composition that does not react with the electrically conductive surfaces, such as slightly diluted acid, acid-based liquids, low viscosity liquid including organic materials (e.g flux), epoxy glues, and/or adhesives.

In yet another embodiment according to the first aspect of the present disclosure, the step of chemically treating of the main surface involves a cleaning step that is performed before depositing the Thiol-ended SAMs and after the step of patterning the seed layer for forming the at least one closed loop structure. The cleaning step removes any impurities from the surface of the at least one closed loop structure and of the at least one micro-bump left during processing the main surface of the substrate. An advantage of this embodiment is that by cleaning the surfaces to be provided with a different surface liquid tension the absorption rate of Thiol-ended SAMs can be enhanced. As a result the contact angle difference between the hydrophobic and hydrophilic regions will be higher, thereby improving the accuracy of the SA method.

In a second aspect of the present disclosure, a method for self-assembling substrates comprising the steps of: providing a first substrate according to the first aspect of the present disclosure, having at least one closed loop structure formed on a main surface; supplying a liquid droplet on the main surface of the first substrate; providing at least one second substrate according to the first aspect of the present disclosure, having at least one closed-loop structure, the at least one closed-loop structure of the second substrate having the same layout with at least one of the at least one closed-loop structures of the first substrate; disposing the second substrate on the liquid droplet, thereby aligning the at least one closed-loop structure of the first substrate to a corresponding at least one closed-loop structure of the second substrate; and heating the first substrate and the at least one second substrate thereby evaporating the liquid droplet and for reflowing the micro-bumps thereby creating a permanent connection between the first substrate and the second substrate.

In an embodiment according to the second aspect of the present disclosure, the at least one closed-loop structure, the surfaces of which are provided with liquid-phobic properties, is used to confine the at least one liquid droplet used during the SA process. The at least one closed-loop structure provided on the first substrate has a corresponding at least one closed-loop structure on the second substrate, the at least one closed-loop structure being identical in terms of layout and dimensions. Material composition being an optional requirement. The alignment of components pulled by the closed-loop structures is driven by capillary forces generated by the difference in surface liquid tension between the surface of the at least one closed-loop structure and the main surface. An advantage of this embodiment is that, by providing a corresponding at least one closed-loop structure on the second substrate, the SA accuracy can be further improved.

In a further embodiment according to the second aspect of the present disclosure, the liquid droplet has an evaporation point that is equal or lower than the melting point of any of the at least on micro-bumps. It is also preferable that the liquid droplet does not react with surfaces causing oxidization that may cause issues during the bonding process, as described in a previous embodiment. For this purpose a diluted acid-based liquid droplet, a low viscosity flux droplet, and/or an epoxy may be used as an alternative to a water-based liquid droplet. The combination of depositing a thiol-ended SAM layer and providing a diluted acid-based liquid droplet ensures that surface of the at least one micro-bump is protected from oxidization, thereby ensuring a good electrical connection between the at least one micro-bump of the first and second substrate. An additional measure to prevent oxidization is to perform the evaporation of the liquid droplet and re-flow of the micro-bumps in a re-flow oven. An alternative method for evaporating the liquid droplet is to let the liquid droplet dry out naturally or by placing the substrate stack on a hot plate. An advantage of this embodiment is that, during the bonding of the substrates, the need for thermo-compression to break the oxide crust formed due to oxidization is not required. Therefore, the bonding step is performed using only substrates gravity, thereby avoiding the yield issues associated with the use of thermo-compression.

In a third aspect of the present disclosure a substrate is provided, the substrate comprising: a seed layer covering at least partially a main surface of the substrate; at least one micro-bump formed on the seed layer thereby leaving part of the seed layer exposed; and at least one closed-loop structure formed on the exposed part of the seed layer and enclosing a region of the main surface.

In a fourth aspect of the present disclosure, a functional system is provided comprising: at least a first substrate according to the third aspect of the present disclosure, and at least one second substrate according to third aspect of the present disclosure, wherein the at least one second substrate is bonded to the first substrate, thereby aligning the at least one closed-loop structure of the second substrate to the corresponding at least one-closed loop structure of the first substrate, having the same pattern as the at least one closed loop structure of the second substrate of the first substrate. The substrate may comprise semiconductor, optoelectronics, or MEMS devices.

Although the present disclosure will be described with references to the use of an SA method for assembling substrates comprising semiconductor, optoelectronics, or MEMS devices into functional system, it is not limited only to this substrates and other implementations are possible. For example the present disclosure can be extended to the use of an SA method for creating functional systems, where the substrate may comprises organic material, a 3-5 compound semiconductor (such as a laser sources onto a photonics substrate), or any material that can be functionalized with self assembled monolayer.

BRIEF DESCRIPTION OF THE DRAWINGS

The disclosure will now be described further, by way of example, with reference to the accompanying drawings, wherein like reference numerals refer to like elements in the various figures.

DETAILED DESCRIPTION

Figure 1:
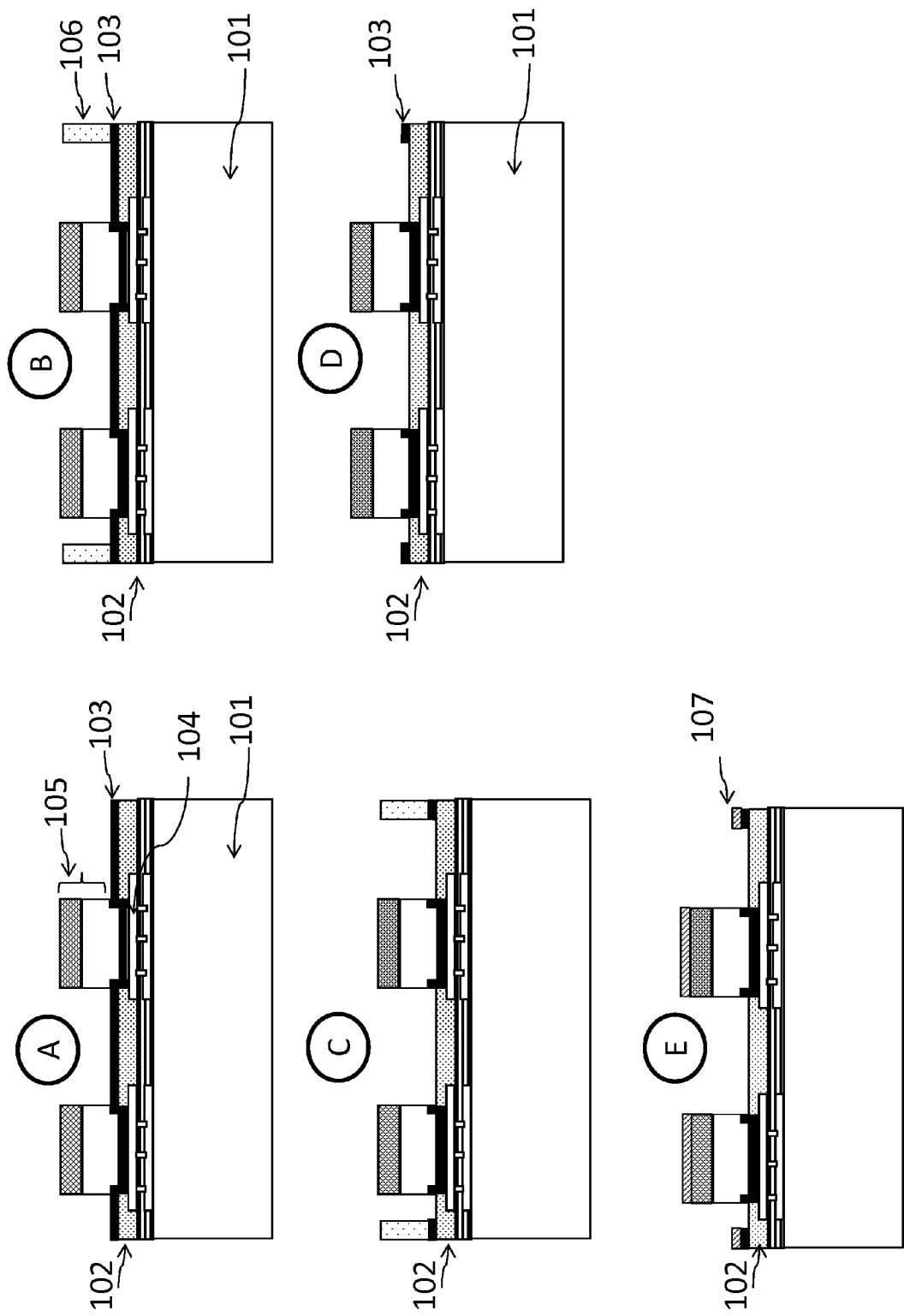
FIGS. 1A-1E present a processing flow for forming structures with different surface liquid tension properties on a substrate, according to an embodiment of the present disclosure.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes.

Moreover, the term top and the like in the description and the claims are used for descriptive purposes and not necessarily for describing relative positions. It is to be understood that the terms so used are interchangeable under appropriate circumstances and that the preferred embodiments described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary preferred embodiments, various features of the disclosure are sometimes grouped together in a single embodiment, figure, or description thereof for the purpose of streamlining the disclosure and aiding in the understanding of one or more of the various aspects. This method of disclosure, however, is not to be interpreted as reflecting an intention that the claimed disclosure requires more features than are expressly recited in each claim. Rather, as the following claims reflect, aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that preferred embodiments may be practiced without these specific details. In other instances, well-known methods, structures and techniques have not been shown in detail in order not to obscure an understanding of this description.

The present disclosure will now be described by a detailed description of several preferred embodiments. It is clear that other preferred embodiments can be configured according to the knowledge of persons skilled in the art without departing from the true spirit or technical teaching of the disclosure as defined by the appended claims.

Integration of devices, such as semiconductor, optoelectronics, or MEMS devices, into multifunction (heterogeneous/homogeneous) systems has become extremely challenging. This is due to the stringent requirements imposed by technology advancements associated to the micro-bump bonding accuracy, assembly process throughput and system yield. Conventional assembly methods, such as robotic pick-and-place tool, are confronted with a trade-off between throughput and accuracy that ultimately impacts the system yield. Therefore, the use of these conventional assembly methods is less preferable. An SA method offers an attractive alternative that can satisfy the assembly requirements imposed by technology advancements.

The present disclosure will be described with references to a method for enabling SA of substrates with accuracy better than 1 μm, and a device obtained thereof. The method presented in this disclosure overcomes the problems of throughput, accuracy, and yield associated with state-of-the-art. This is achieved by accurate defining on the main surface of the substrate regions with different surface liquid tension properties.

Although the present disclosure will be described with references to the use of the SA method for assembling substrates comprising semiconductor, optoelectronics, or MEMS devices into a functional system, it is not limited only to these substrates, and other implementations are possible. For example, the present disclosure can be extended to the use of an SA method for creating functional systems, where the substrate may comprises organic material, a 3-5 compound semiconductor (such as a laser sources onto a photonics substrate), or any material that can be functionalized with a self-assembled monolayer.

According to one embodiment, a set of process steps for accurately defining regions with different surface liquid tension properties on the main surface of a substrate is described in FIGS. 1A-1E, wherein the substrates may comprise semiconductor, optoelectronics, or MEMS devices. The method starts by providing in step 1 (FIG. 1A), a substrate 101 with a main surface 102, wherein the main surface is covered or at least partially covered with a seed layer 103. The seed layer 103 is a thin (around 0.15 nm thick), electrically conductive layer used in as part of the bumping process for forming micro-bumps 105, such as Cu, TiN, Ti, TiW, Ta, TaN, Al, Sn, etc. During the bumping process, the micro-bumps 105 are formed via electroplating on corresponding contact pads 104, thereby electrically connecting the micro-bump 105 to devices fabricated in the substrate, such as transistors; interconnect layers (BEOL), MEMS devices, etc. The micro-bumps 105 offer the possibility for interconnecting different substrates to form a single functional system. Depending on the application requirements the micro-bumps 105 may comprise a variety of solder materials or a combination of solder materials, such as Cu-based solders, Sn-based, In-based solders, and/or any other suitable solder materials. Cu and CuSn micro-bumps are most commonly used as they are cost effective and require a low temperature budget to create permanent interconnects. After the formation of the micro-bumps 105, the exposed seed layer 103 remaining on the main surface 102 is patterned to define at least one region with different surface liquid tension properties. The at least one region is defined in the shape of a closed-loop structure enclosing an area of the main surface. This is accomplished by depositing a photoresist 106 on specific locations of the seed layer 103, thereby forming at least one closed-loop structure and leaving part of the seed layer 103 exposed, as shown in step 2 (FIG. 1B). The exposed seed layer 103 is then etched, as shown in step 3 (FIG. 1C), thereby exposing part of the main surface 102. The photoresist is finally removed, as shown in step 4 (FIG. 1D), leaving the seed layer 103 exposed, wherein the seed layer 103 forms at least one closed-loop structure. In step 5 (FIG. 1E), the main surface 102 of the substrate 101 is functionalized through chemical treatment to form regions of different surface liquid tension properties. This is achieved by depositing a material 107 on main surface 102 that selectively reacts with the surfaces of at least one closed-loop structure and at least one of the micro-bumps 105, thereby obtaining a surface liquid tension property that is different to the surface liquid tension property of the main surface 102. By using at least the seed layer 103 or the micro-bumps 105 to form the at least one-closed loop structure, and thereby defining at least one region having different surface liquid properties to that of the main surface 102, SA accuracy can be improved. This is because the patterning step is performed at the same processing step with the bumping process for forming the micro-bumps 105. As a result the same photo-mask may be used to define both the at least one closed-loop structure and the micro-bumps 105, thereby minimizing the misalignment caused by photolithography tool error.

According to another embodiment, the main surface of the substrate can be functionalized in many different ways to accomplish different configurations of regions on the main surfaces having different surface liquid tension properties. These regions can be identified by the resulting contact angle of a liquid droplet dispensed therein. Therefore, a liquid droplet dispensed on a liquid-repellent or liquid-phobic region will have a higher contact angle than the resulting contact angle of a liquid dispensed on a liquid-absorbent or liquid-philic region. The type of surface liquid tension properties to be provided on the main surface depends highly on the chemical composition of the liquid droplet to be used during SA. Water-based liquid droplets are commonly used during SA. In this case, the main surface may be provided with hydrophilic properties, while the surfaces of the surrounding at least one closed-loop structure and at least one micro-bump may be provided with hydrophobic properties. Therefore, the water-based liquid droplet will be confined by hydrophobic region formed on at the least one closed-loop structure. In order to provide the hydrophobic properties on the surfaces of the at least one closed-loop structure and the at least one micro-bump, the material selected to be deposited may belong to a group of thiol-ended SAMs. The main advantage of using a thiol-ended SAM is that it can be selectively absorbed by electrically conductive materials found on the surfaces of the at least one closed-loop structure and the at least one micro-bump, thereby rending these surfaces hydrophobic. The selective absorption properties of thiol-ended SAMs result in the functionalization of the main surface with regions of different surface liquid tension properties. An additional advantage of this embodiment is that thiol-ended SAMs are compatible with conventional fabrication process flows and can be deposited from the vapor or liquid phase. Moreover, the use of a water-based liquid might result in oxidization of the surfaces of the at least one closed-loop structure and the at least one micro-bump. The use of thiol-ended SAMs protects the surfaces of the at least one closed-loop structure and the at least one micro-bump from oxidization during the SA method. Oxidization can be further prevented by the use of a different chemical composition liquid droplet that does not react with the electrically conductive surfaces, such as slightly diluted acid.

It is to be understood that the polarity of the surface liquid tension properties of the main surface depends on material selected to be deposited. Therefore, the deposition of a material other than SAM may result in polarity of the surface liquid tension properties of the main surface being reversed.

The final accuracy of the SA method is highly influenced by the contact angle contrast between the regions of different surface liquid tension properties. Higher contact angle contrast will result in higher SA accuracy. In order to achieve this, a cleaning step may be performed between step 4 and step 5. By performing a cleaning step, any impurities left on the surfaces of the at least one closed loop structure and at least one micro-bump during the different processing steps are removed. As a result the thiol-ended SAM is directly deposited on the electrically conductive materials, thereby enhancing the absorption rate of the thiol-ended SAM on the surfaces. As a result the contact angle contrast between the hydrophobic and hydrophilic regions will be sharper, thereby improving the accuracy of the SA method.

Figure 2:
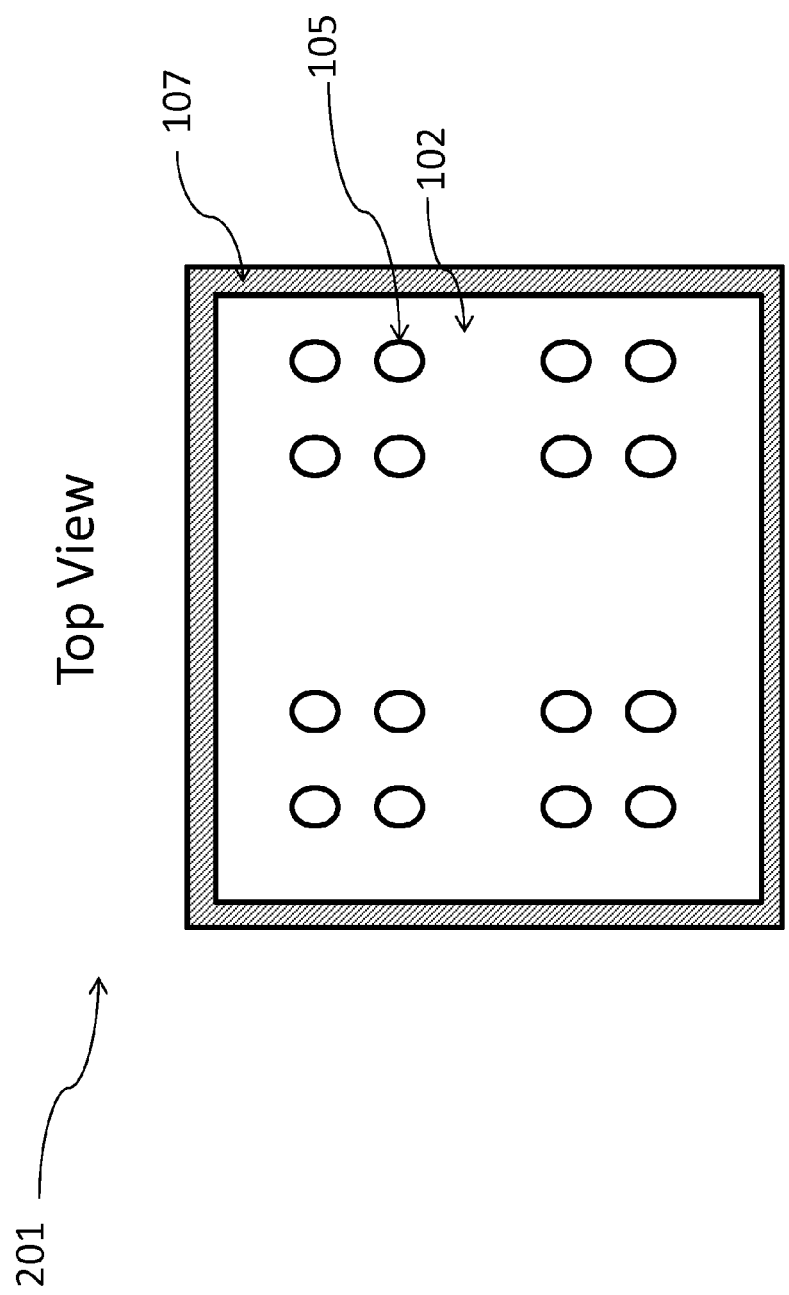
FIG. 2 presents the top view of a substrate device obtained from the processing steps presented in FIG. 1A-1E.

FIG. 2 shows a top view of a substrate obtained from the processing steps presented in FIGS. 1A-1E, wherein the substrates may comprise semiconductor, optoelectronics, or MEMS devices. In this embodiment, a substrate is provided comprising the at least one closed-loop structure 107 formed by patterning the seed layer 103 and positioned around the substrate 101 edge, thereby enclosing an area of the main surface that comprises a plurality of micro-bumps 105.

As previously described, the liquid droplet used during SA will be confined by the at least one closed-loop structure. This embodiment presents only one possible configuration and as it will be become evidently at a later stage, different configurations of forming the at least one closed-loop structure to support different integration schemes are possible.

Figure 3:
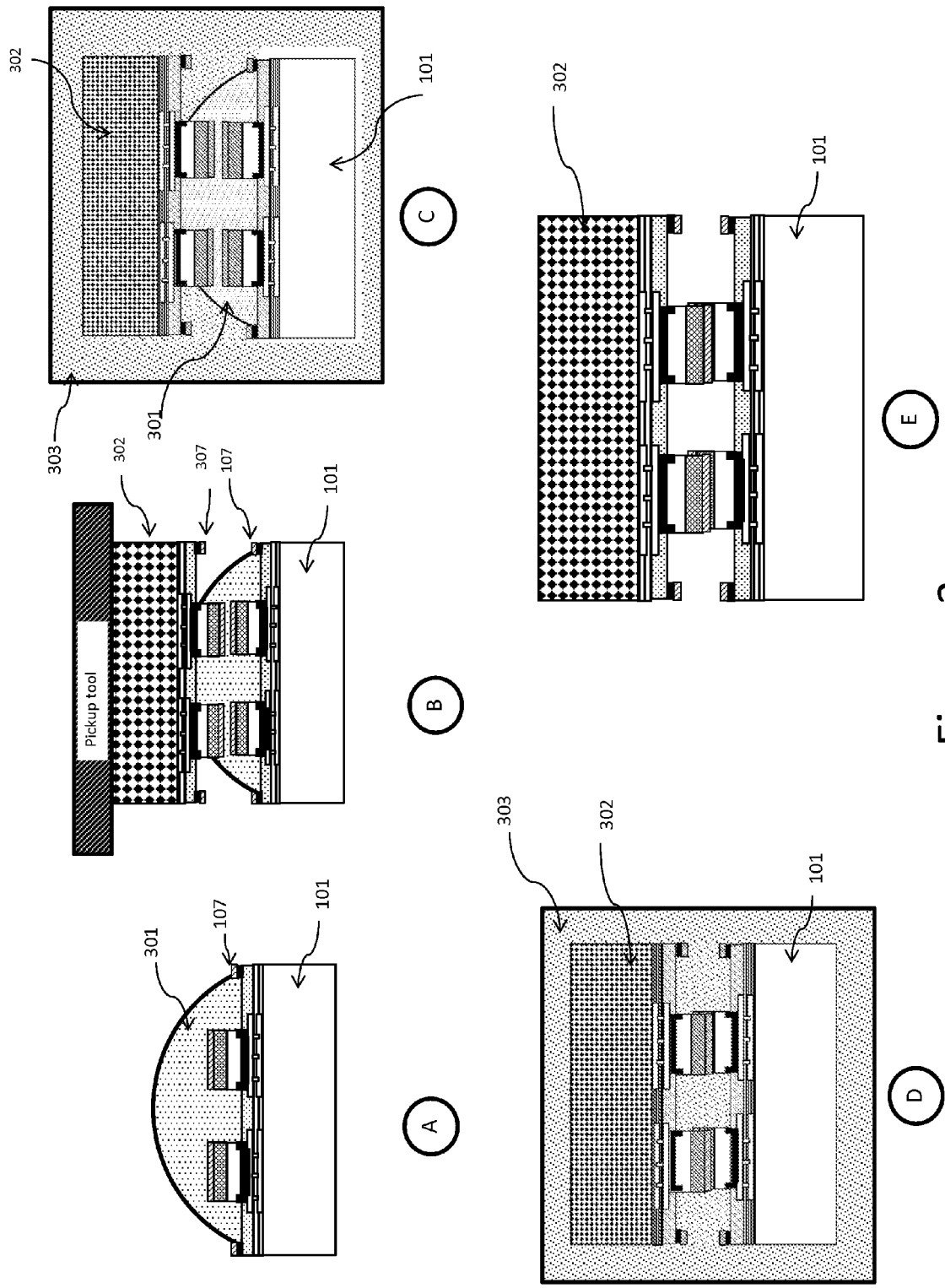
FIGS. 3A-3E describe a processing flow for self-assembling substrates into a functional system, according to an embodiment.

A process flow for self-assembling substrates in accordance with one embodiment of the present disclosure is presented in FIGS. 3A-3E, wherein the substrates may comprise semiconductor, optoelectronics, or MEMS devices. A first substrate, processed in accordance with the steps described in FIG. 1A-1E, is provided. In this embodiment, the first substrate 101 is used as the bottom substrate. The assembly process starts, as shown in FIG. 3A, by providing on the main surface of the first substrate 101 a liquid droplet 301 on the location(s) of the at least one closed loop structure 107. The hydrophobic surface properties of the at least one closed-loop structure will confine the liquid droplet in place. In this case the liquid droplet may be water-based or acid-based, as previously described. However, other liquids with an evaporation point less than or equal to the melting point of the at least one micro-bump solder can also be used. Once the liquid droplet 301 has been dispensed on the at least one closed-loop structure 107, a second substrate 302, processed in accordance with the steps described in FIG. 1A-1E, is provided, as shown in FIG. 3B. The second substrate 302 comprises at least one closed-loop structure 307 corresponding to the at least one closed-loop structure 107 of the first substrate. The second substrate 302 is positioned using a pickup tool on top of the first substrate 101, in a way such that the corresponding at least one closed-loop structures 107, 307 of the first substrate 101 and of the second substrate 302 are facing one another. Once the two substrates 101, 302 are roughly pre-aligned, the pickup tool releases the second substrate 302 and the two substrates are self-assembled, thereby forming a substrate stack. The self-assembly of the substrate stack is driven by capillary forces generated by the different surface liquid tension properties provided on the main surfaces of the two substrates. Once the SA is completed, the liquid droplet needs to be evaporated. This can be done by leaving the liquid droplet to dry out naturally or by using a hot plate to speed up the process. A more preferred method, shown in FIG. 3C, is to perform this step in a reflow oven 303. The liquid droplet 301 is evaporates by increasing the temperature to the desired level, as shown in FIG. 3D. Once the liquid droplet 301 is evaporated, the micro-bump solder melts, thereby forming permanent connections between the substrates 101, 302, as shown FIG. 3D. An advantage of performing the evaporation of the liquid droplet 301 in the reflow oven 303 is that the micro-bump solder is not exposed to the air once the liquid droplet is evaporated, thereby preventing oxidization of the micro-bump surfaces. As a result, the need for thermo-compression to break the oxide crust formed due to oxidization is not required. Therefore, the bonding step is performed using only gravity generated by the weight of the substrates, thereby avoiding the yield issues associated with the use of thermo-compression.

FIG. 3E presents the resulting functional system obtained through the SA process flow. The functional system comprises the first substrate 101 and at least the second substrate 302, wherein the at least one second substrate 302 is bonded on the first substrate 101, thereby aligning the at least one closed-loop structure 107 of the first substrate 101 to a corresponding at least one closed-loop structure 307 of the second substrate 302.

Figure 4A:
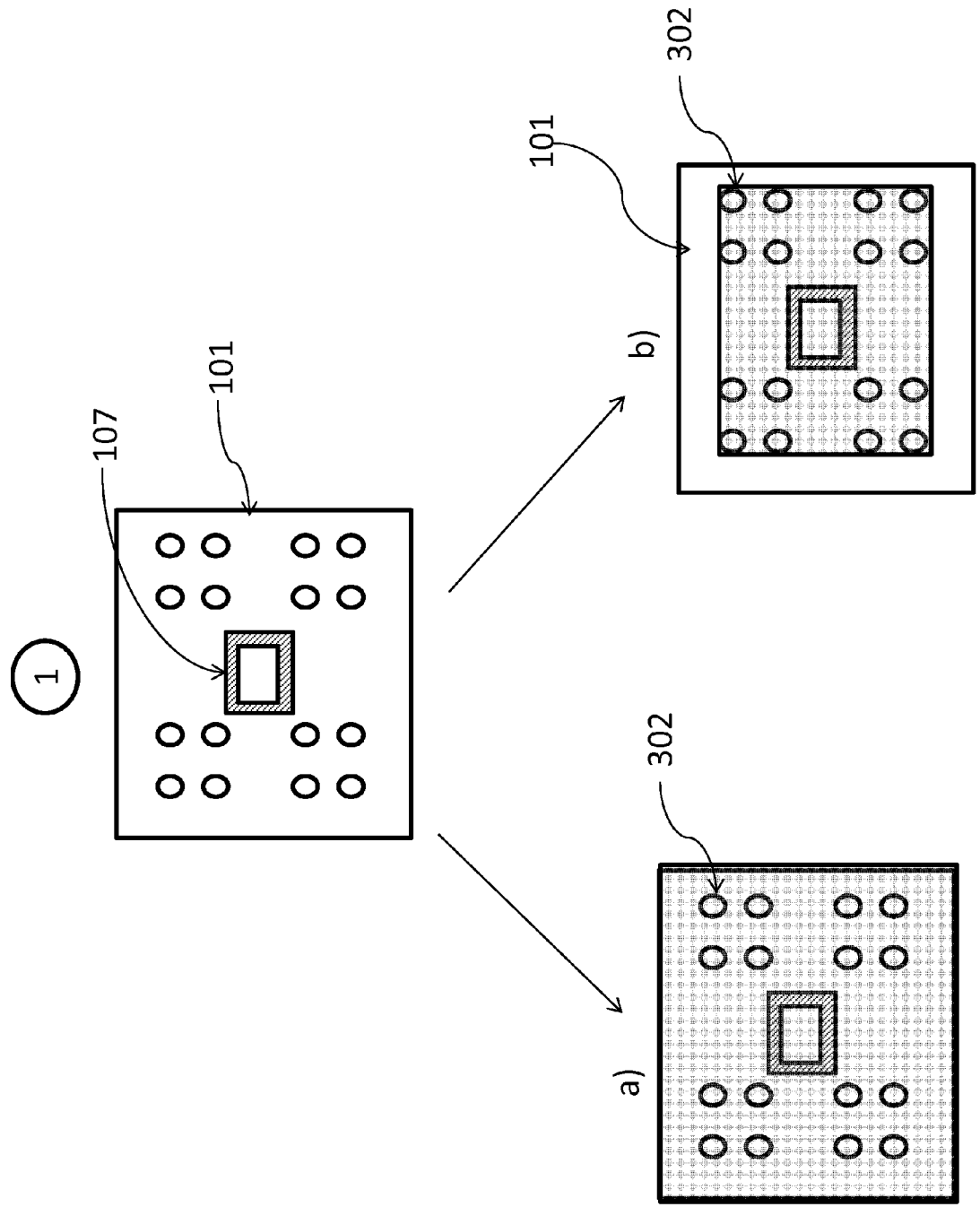
FIGS. 4A-4C present embodiments of different integration schemes using the proposed SA method.
Figure 4B:
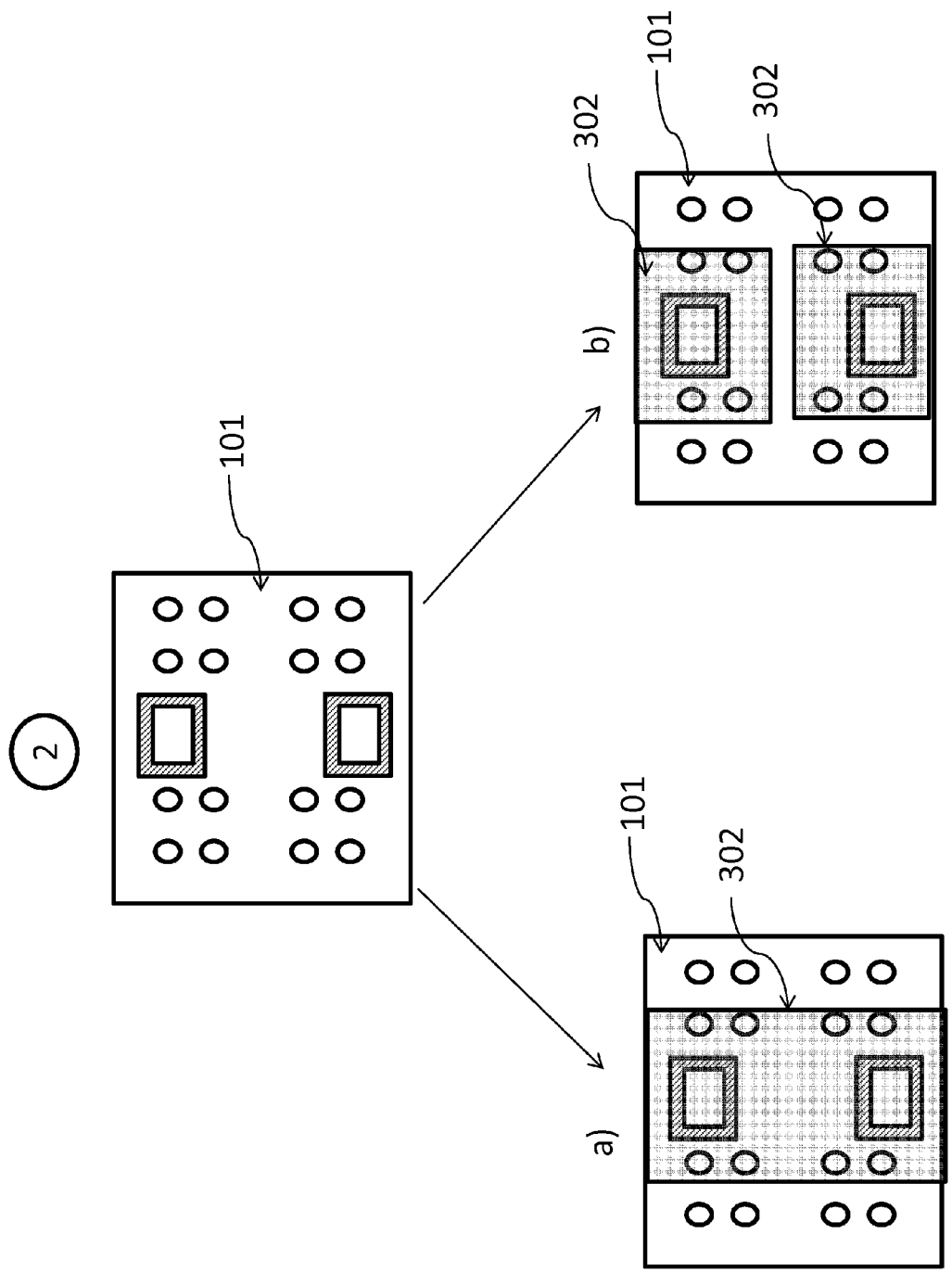
Figure 4C:
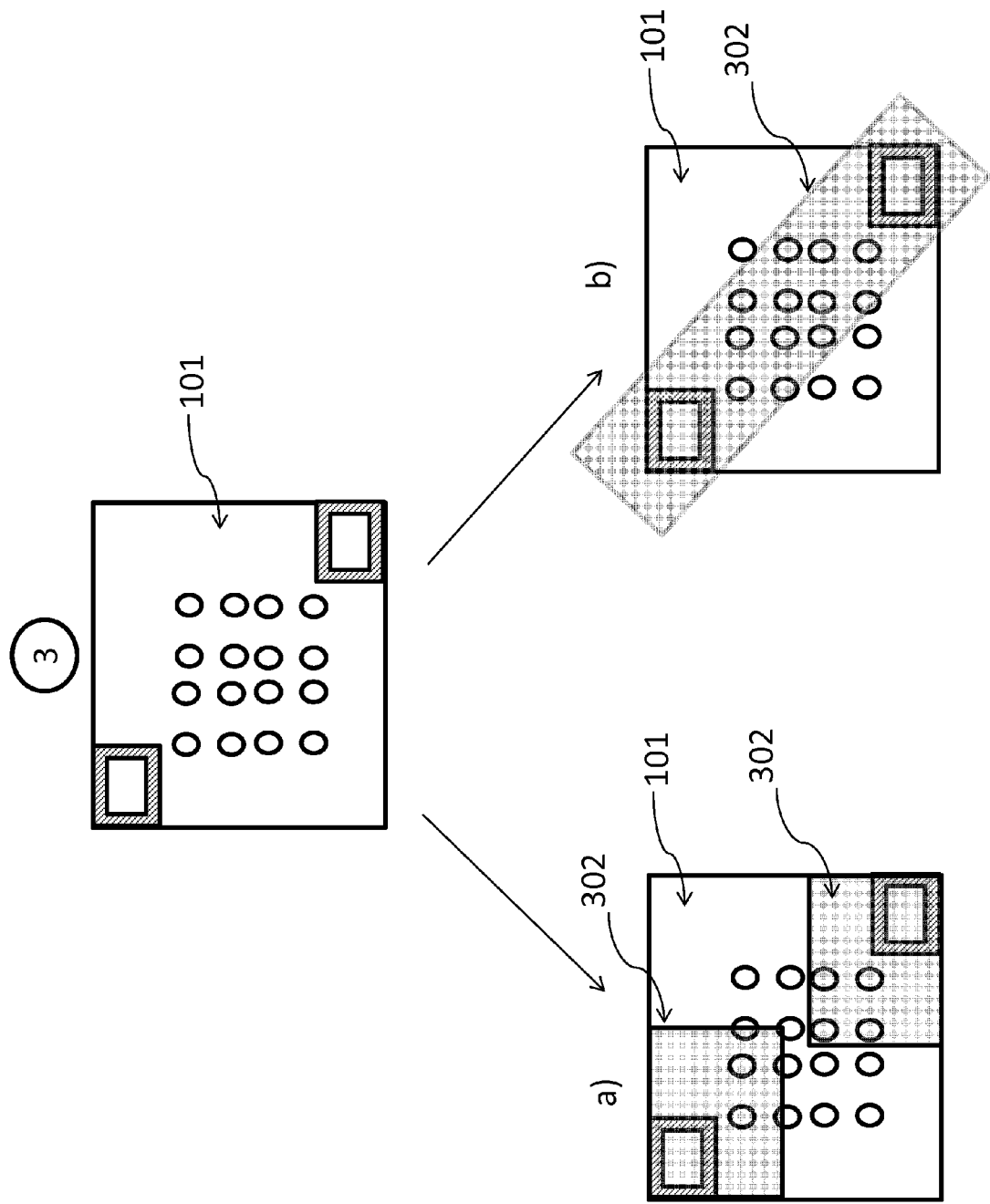

FIGS. 4A-4C present some embodiments of different integration schemes for self-assembling substrates resulting in functional systems. The embodiments presented do not represented an exhaustive list of integration schemes and other integration schemes are possible.

FIG. 4A presents a first substrate 101 comprising a closed-loop structure 107 positioned in the center of a main surface. This embodiment can be used for assembling a second substrate 302 having the same dimensions the first substrate 101. In this case, having a smaller closed-loop structure 107 defined in the middle of the first substrate 101 may be beneficial for saving are on the main surface. This embodiment can also be used for assembling a second substrate 302 being substantially smaller than the first substrate 101. As a result, devices with smaller footprints can be integrated, thereby relaxing the constraints on the dimensions of the devices to be integrated.

FIG. 4B presents a first substrate 101 having two closed-loop structures 107 positioned in the center of the main surface. This embodiment can benefit the assembly a second substrate 302 having smaller or similar dimensions to first substrate 101. Having two closed-loop structures, as opposed to only one, can enhance the accuracy of the SA method. This embodiment can also be used for assembling more than one second substrate (e.g two) being substantially smaller than the first substrate, wherein the two substrates have the same or different functionality. As a result a more traditional SoC approach can be implemented.

FIG. 4C presents a first substrate 101 having two closed-loop structures 107 positioned at opposing corners of the main surface 102. This embodiment can be used in the assembly of a second substrate 302 positioned diagonally to the first substrate 101. As a result, more exotic integration schemes can be realized to benefit applications using optoelectronics or MEMS devices.

What is claimed is:

1. A method for defining regions on a substrate with different surface liquid tension properties comprising:
    providing a substrate with a main surface that has a first surface liquid tension property and is at least partially covered with a seed layer;
    forming at least one micro-bump on the seed layer leaving a portion of the seed layer exposed;
    exposing part of the main surface by patterning the exposed seed layer;
    forming from the seed layer at least one closed-loop structure that encloses a region of the main surface that includes the at least one micro-bump; and
    chemically treating the main surface of the substrate to provide a surface of the at least one closed-loop structure and the at least one micro-bump with a second surface liquid tension property that is substantially different from the first surface liquid tension property, wherein the second surface liquid tension property is liquid phobic.

2. The method according to claim 1, wherein chemically treating the main surface of the substrate further comprises depositing a material on the main surface of the substrate that is selected to provide the surface of the at least one closed-loop structure and the at least one micro-bump with the second surface liquid tension property.

3. The method according to claim 2, wherein the deposited material is a thiol-ended self-assembly monolayer.

4. The method according to claim 3, wherein the material is deposited from a liquid phase or a vapor phase.

5. The method according to claim 1, wherein the surface of the at least one closed-loop structure and the at least one micro-bump comprises an electrically conductive material.

6. The method according to claim 1, wherein chemically treating the main surface of the substrate further comprises cleaning the surface of the at least one closed-loop structure and the at least one micro-bump.

7. The method according to claim 1, wherein the substrate comprises at least one of a semiconductor, an optoelectronics, or a MEMS device.

8. A method for self-assembling substrates comprising:
providing a first substrate that includes first closed-loop structures formed on a first main surface, wherein each of the one or more first closed-loop structures enclose a region of the first main surface that includes at least one micro-bump;
supplying a liquid droplet on the main surface of the first substrate;
providing at least one second substrate that includes one or more second closed-loop structures formed on at least one second main surface, wherein each of the one or more second closed-loop structures encloses a region of the at least one second main surface that includes at least one micro-bump, and wherein at least one of the one or more second closed-loop structures has a substantially same layout as one of the one or more first closed-loop structure;
disposing the at least one second substrate on the liquid droplet to align the at least one of the one or more second closed-loop structures with the one of the one or more first closed-loop structures; and
heating the first substrate and the at least one second substrate to evaporate the liquid droplet and to reflow the micro-bumps enclosed by the one or more first closed-loop structures and the one or more second closed-loop structures to create a permanent connection between the first substrate and the at least one second substrate, wherein providing each of the first substrate and the at least one second substrate comprises:
providing a substrate with a main surface that has a first surface liquid tension property and is at least partially covered with a seed layer;
forming at least one micro-bump on the seed layer leaving a portion of the seed layer exposed;
exposing part of the main surface by patterning the exposed seed layer;
forming from the seed layer at least one closed-loop structure that encloses a region of the main surface that includes the at least one micro-bump; and
chemically treating the main surface of the substrate to provide a surface of the at least one closed-loop structure and the at least one micro-bump with a second surface liquid tension property that is substantially different from the first surface liquid tension property, wherein the second surface liquid tension property is liquid phobic.

9. The method according to claim 8, wherein the liquid droplet is confined to one of the one or more first closed-loop structures.

10. The method according to claim 8, wherein an evaporation point of the liquid droplet is less than or equal to a melting point of any of the micro-bumps enclosed by the one or more first closed-loop structures and the one or more second closed-loop structures.

11. The method according to claim 8, wherein:
the first main surface and the at least one second main surface have a first surface liquid tension property;
the one or more first closed-loop structures and the one or more second closed-loop structures have a second surface tension property; and
an alignment of the one of the one or more first closed-loop structures and the at least one of the one or more second closed-loop structures is driven by capillary forces generated by a difference in the first surface liquid tension property and the second liquid surface tension property.

12. The method according to claim 8, wherein at least one of the first substrate or the at least one second substrate further comprises at least one of a semiconductor, an optoelectronics, or a MEMS devices.

13. A substrate comprising
a seed layer at least partially covering a main surface of the substrate, wherein the main surface has a first surface liquid tension property;
at least one micro-bump formed on the seed layer; and
at least one closed-loop structure formed on the seed layer that encloses a region of the main surface that includes the at least one micro-bump, wherein surface liquid tension properties of surfaces of the at least one closed-loop structure and the at least one micro-bump are substantially different from the first surface liquid tension property, and wherein the second surface liquid tension property is liquid phobic.

14. The substrate according to claim 13, wherein the substrate further comprises at least one of a semiconductor, an optoelectronic, or a MEMS device.

15. A functional system comprising:
a first substrate and at least one second substrate, wherein:
each of the first substrate and the at least one second substrate includes:
a seed layer at least partially covering a main surface of the substrate, wherein the main surface has a first surface liquid tension property;
at least one micro-bump formed on the seed layer; and
at least one closed-loop structure formed on the seed layer that encloses a region of the main surface that includes the at least one micro-bump, wherein surface liquid tension properties of surfaces of the at least one closed-loop structure and the at least one micro-bump are substantially different from the first surface liquid tension property, and wherein the second surface liquid tension property is liquid phobic; and
the second substrate is bonded on the first substrate by aligning the at least one closed-loop structure of the at least one second substrate to the at least one closed-loop structure of the first substrate, wherein the at least one closed-loop structure of the first substrate and the at least one closed-loop structure of the second substrate have a substantially same pattern.

* * * * *